US 6,714,419 B2

(12) United States Patent
Liken et al.

(10) Patent No.: US 6,714,419 B2
(45) Date of Patent: Mar. 30, 2004

(54) SUPPORT RACK FOR VIBRATORY TESTING OF PRINTED CIRCUIT BOARDS

(75) Inventors: Peter A. Liken, West Olive, MI (US); Michael J. Bosscher, Jenison, MI (US)

(73) Assignee: Venturedyne, Ltd., Milwaukee, WI (US)

( * ) Notice: Subject to any disclaimer, the term of this patent is extended or adjusted under 35 U.S.C. 154(b) by 0 days.

(21) Appl. No.: 09/841,032

(22) Filed: Apr. 24, 2001

(65) Prior Publication Data

US 2002/0154489 A1 Oct. 24, 2002

(51) Int. Cl.$^7$ .............................. H05K 5/00; H05K 5/04; H05K 5/06
(52) U.S. Cl. ...................... 361/752; 361/796; 361/801
(58) Field of Search ........................... 361/752–753, 361/796–802, 725–731, 707–710; 312/223.1, 223.2

(56) References Cited

U.S. PATENT DOCUMENTS

| | | |
|---|---|---|
| 3,014,594 A | 12/1961 | Kerstner |
| 3,184,069 A | 5/1965 | Rosenberg |
| 3,271,626 A * | 9/1966 | Howrilka ................ 211/41.17 |
| 3,640,399 A | 2/1972 | Hartman |
| 3,829,741 A | 8/1974 | Athey |
| 3,932,016 A | 1/1976 | Ammenheuser |
| 4,019,099 A | 4/1977 | Calabro |
| 4,184,599 A | 1/1980 | Drake et al. |
| 4,261,465 A | 4/1981 | Thomas |
| 4,407,416 A * | 10/1983 | Anderson ................ 211/183 |
| 4,644,444 A | 2/1987 | Rush |
| 4,706,819 A | 11/1987 | Elliott |
| 4,750,088 A | 6/1988 | Friot |
| 5,506,751 A * | 4/1996 | Chatel ................ 361/690 |

* cited by examiner

*Primary Examiner*—Kamand Cuneo
*Assistant Examiner*—Tuan Dinh
(74) *Attorney, Agent, or Firm*—Jansson, Shupe & Munger, Ltd.

(57) ABSTRACT

A circuit board support rack for vibratory testing of printed circuit board comprises a frame and a board engagement platform fixed with respect to such frame. A board retention member is spaced from the engagement platform. The rack has a first adjustment mechanism, e.g., rows of vertically-spaced apertures, any of which may receive a shoulder screw to thread to the retention member. Such first adjustment mechanism coacts with the frame and the retention member, thereby permitting selection of the dimension by which the engagement platform and the board retention member are spaced apart. The rack also has a second adjustment mechanism, e.g., a plurality of screws threaded to the retention member. Each such screw has a notched locating pin coupled to it. Such second adjustment mechanism is mounted for locating-pin movement toward and away from the engagement platform. The first adjustment mechanism permits configuring the rack for the approximate vertical height of the boards to be tested and the second adjustment mechanism permits secure edge clamping of each board as it is loaded into the rack for vibratory testing.

20 Claims, 4 Drawing Sheets

SUPPORT RACK FOR VIBRATORY TESTING OF PRINTED CIRCUIT BOARDS

FIELD OF THE INVENTION

The invention relates generally to the field of support racks and, more particularly, to racks used to support printed circuit boards.

BACKGROUND OF THE INVENTION

Few products are sold by their manufacturer without some type of testing being conducted. Such testing may be as simple as manually ascertaining whether certain parts are securely affixed—or as complex as "stress testing." In stress testing (or "stress screening" as it is sometimes called), products exhibiting "infant mortality" fail outright during the test. Or as the result of such testing, a product may evidence the likelihood of early failure in the operating environment. And some aspects of stress testing involve testing to destruction while measuring certain performance parameters and/or the elapsed time to failure.

Stress testing is most frequently employed with respect to products used in demanding applications and for which exceptionally-high reliability is required. Examples include products used on ground-travelling military equipment and products (e.g., electronic and electromechanical products) used in aircraft of essentially all types.

Stress testing may be carried out in any of several different ways. One type of test regimen involves imposing rapid, extreme changes in temperature upon the product. As an example, a test chamber may be used to change the temperature of a product at the rate of, e.g., 10 degrees C. (about 18 degrees F.) per minute. Exemplary environmental test chambers used for such test regimens are disclosed in U.S. Pat. No. 5,072,177 (Liken et al.) and U.S. Pat. No. 5,191,282 (Liken et al.).

Another type of stress testing involves testing a product by subjecting it to vibrations of the type which might be encountered in actual product use. Vibration stresses on the order of ten times the force of gravity ("10 Gs") are not uncommon. Vibration testing is carried out by mounting the product to be tested upon some sort of platform or table and then vibrating the table using a rotating eccentric or a linear vibrator. An exemplary vibrator-driven table apparatus used for such stress testing is disclosed in U.S. Pat. No. 5,804,732 (Wetzel et al.).

Yet another type of stress testing is known as highly accelerated stress testing (HAST) and involves subjecting products, e.g., printed circuit boards (PCBs), to vibrational stress forces as high as 50Gs. Such forces are applied randomly to the product along and in six axes of motion (as the industry describes it), i.e., along each of the linear X, Y and Z axes and in rotational axes about such linear axes. Such vibrational testing may be carried out alone or while the PCBs are also subjected to extreme thermal stress involving temperature changes at the rate of 60 degress C. (about 110 degrees F.) per minute. In the latter instance, the vibrator table with PCBs supported thereon is placed inside a chamber. Such chamber is configured with heating and refrigeration capabilities to permit extreme and rapid temperature changes inside the chamber simultaneously with vibration testing. A leading manufacturer of environmental and vibrational testing equipment is Thermotron Industries of Holland, Mich.

When configuring PCB support racks for such tests, there are number of design considerations. Among them are circulation of air around the PCBs (to facilitate the afore-described rapid changes in the temperature of the boards) and transfer of vibrational forces to the PCBs.

While prior art PCB support racks (such as, e.g., the carrier disclosed in U.S. Pat. No. 5,268,637 (Liken et al.) have been generally satisfactory for their intended purposes, they are not adequate for vibrational testing, especially the HAST regimen described above. A reason relates to transfer of vibrational forces from the vibrator table to the PCBs. The carrier shown in the aforementioned Liken et al. '637 patent contemplates slide-in and plug-in board mounting. Such mounting does not adequately transfer vibrational forces.

An improved support rack for vibration and thermal testing of printed circuit boards would be a distinct advance in the art.

OBJECTS OF THE INVENTION

It is an object of the invention to provide a circuit board rack overcoming some of the problems and shortcomings of earlier racks.

Another object of the invention is to provide a circuit board support rack which may be used for highly accelerated stress testing.

Yet another object of the invention is to provide a circuit board support rack with rigidity and board clamping capability selected to cause transmission of the energy of vibration from a vibratory table to the boards undergoing test.

Another object of the invention is to provide a circuit board support rack which accommodates a range of sizes of printed circuit boards.

Still another object of the invention is to provide a circuit board support rack configured to permit ample air flow around and across the boards for thermal stress testing. How these and other objects are accomplished will become apparent from the following descriptions and from the drawings.

SUMMARY OF THE INVENTION

The invention involves a rack for supporting printed circuit boards during vibratory (and, optionally, thermal) testing which, often, involves testing the boards to destruction. The purpose of such testing is to ascertain how sturdily the boards are designed and manufactured and how much severe service they might withstand before failure.

The new circuit board support rack comprises a frame which is generally orthogonal in configuration and includes a pair of upright, longitudinally-spaced end panels having a pair of laterally-spaced lower rails extending therebetween. A board engagement platform is fixed with respect to the frame and is "framed" by the end panels and rails. Such platform includes plural edge engagement members extending laterally between the rails. Each such member has a linear engagement groove for receiving and securing the lower edge of a respective printed circuit board.

Spaced above the platform by some dimension and oriented generally parallel thereto is a board retention member. The dimension by which such member is spaced from the engagement platform may be selected by a first adjustment mechanism. In a specific embodiment, each end panel has two vertical rows of apertures. Such rows are spaced laterally from one another and the apertures defining a row are, preferably, spaced vertically from one another.

When the board retention member is located at the approximate desired dimension above the engagement platform (i.e., desired in view of the edge-to-edge measurement of the boards to be supported), respective shoulder screws are inserted through corresponding apertures in each of the four vertical rows of apertures and threaded snugly into the retention member. The apertures and shoulder screws coact with the frame and the retention member and comprise the first adjustment mechanism. Such mechanism permits adjusting, in small, predetermined increments, the dimension between the platform and the retention members Assuming the end panels, rails, engagement platform and retention member are tightly and securely affixed to one another, the rack will transmit vibration from the vibratory table to the circuit boards under test.

The rack also includes at least one second adjustment mechanism (and preferably a plurality thereof) on the retention member. Each such second adjustment mechanism is mounted for movement toward and away from the engagement platform while the platform-to-retention member dimension is held substantially constant. In a specific, highly preferred embodiment, the rack has at least first and second pluralities of second adjustment mechanisms. Most preferably, each plurality includes three laterally-spaced adjustment mechanisms.

Merely as an example, the first plurality of second adjustment mechanisms includes first, second and third adjustment mechanisms. Further, each of the latter mechanisms comprises a respective clamping screw (i.e., first, second and third clamping screws), each having its own locating pin (i.e., first, second and third locating pins). When the first or lower and second or upper edges of a printed circuit board are inserted between, respectively, a particular edge engagement member and the second adjustment mechanism (or plurality of such mechanisms) immediately thereabove, the locating pins of the individual mechanisms are oriented so that the notches therein engage the upper printed circuit board edge. The second adjustment mechanisms are tightened to securely hold the board for vibratory testing. When such mechanisms are tightened, compressive force is exerted on the boards by the engagement platform and the retention member. Such force might be considered to be exerted substantially parallel to or substantially coincident with a planar surface of the printed circuit board.

From the foregoing and, particularly, from the drawings and the detailed description which follows, certain dimensional relationships of a specific, preferred embodiment will be apparent. The first dimension, i.e., that dimension between the engagement platform and, say, the underside of the board retention member, may be selected in increments that are predetermined by the spacing between apertures of the first adjustment mechanism. It is fair to say that this configuration permits adjustment that is somewhat "coarse."

It is to be understood that the locating pins protrude below the underside of the retention member. Thus, the locating pins (or at least an exemplary pin) is spaced from the engagement platform by a second dimension which is somewhat less than the first dimension. The aforedescribed configuration of the second adjustment mechanism permits the second dimension to be selected in a continuum rather than in descrete increments. One might say that such configuration permits "fine" adjustment to securely clamp each of the boards to undergo test.

To effect such testing, the frame (and, more specifically, each of the rails of such frame) include plural openings therealong. The spacing between such openings is preferably selected to conform to the spacing of holes in the vibratory table. To secure the rack, boards and vibratory table to one another, bolts are extended through such openings and threaded into the holes in the table.

Further details of the invention are set forth in the following detailed description and in the drawings.

DETAILED DESCRIPTIONS OF PREFERRED EMBODIMENTS

Figure 1:
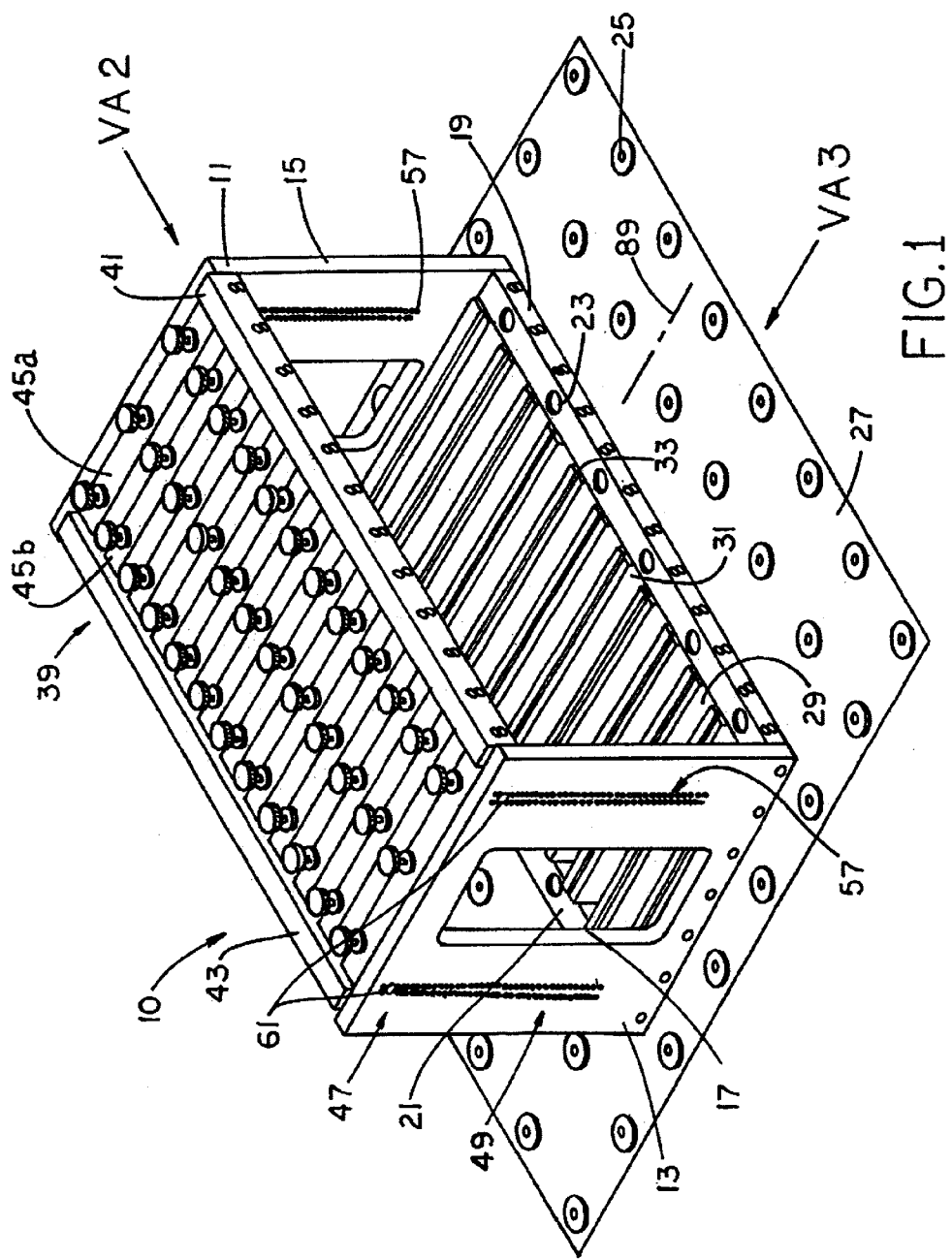
FIG. 1 is a perspective view of the new support rack shown in connection with a vibrator table.
Figure 2:
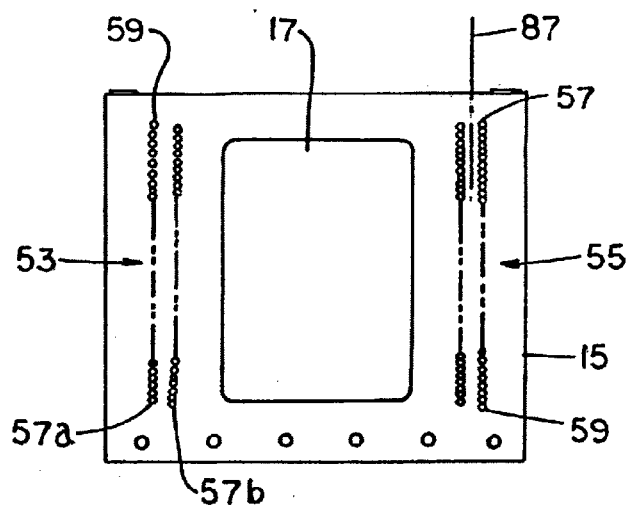
FIG. 2 is an elevation view of one of the end panels of the rack of FIG. 1 taken along the viewing axis VA2.
Figure 3:
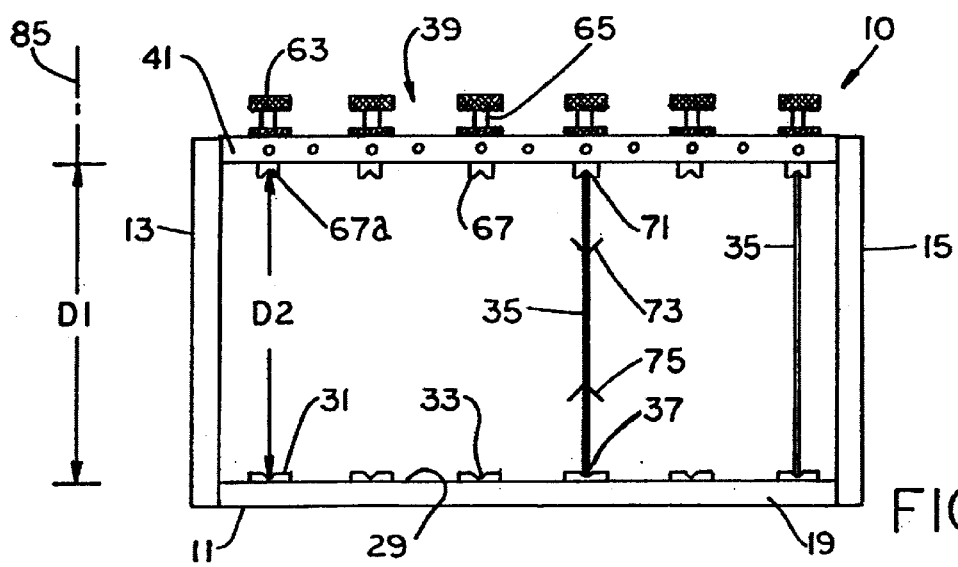
FIG. 3 is a side elevation view of the rack of FIG. 1 taken along the viewing axis VA3 and with the vibrator table omitted and two rack-mounted circuit boards included.

Referring first to FIGS. 1, 2 and 3, the inventive support rack 10 includes a frame 11 which is generally orthogonal and includes upright, generally planar first and second end panels 13, 15, respectively, which are parallel to and longitudinally-spaced from one another. Each panel 13, 15 has an air circulation window 17 formed in it. Extending between the panels 13, 15 and generally perpendicular thereto are elongate, laterally-spaced first and second rails 19, 21, respectively.

Each rail 19, 21 has a plurality of openings 23 therealong. Such openings 23 are preferably sized and spaced in view of the size and spacing of the openings 25 in the top of the vibrator table 27. In that way, the rack 10 can be readily bolted to the table 27. A board engagement platform 29 is rigidly fixed between the end panels 13, 15 and between the rails 19, 21 and has at least one (and preferably a plurality) of engagement members 31, each having a linear engagement groove 33 formed therein. As described in more detail below, circuit boards 35 to undergo test have their lower or first edges 37 received in respective grooves 33.

The rack 10 also includes a board retention member 39 which is generally parallel to the platform and is spaced above such platform by dimension D1. The member 39 has elongate, laterally-spaced first and second support bars 41, 43, respectively. The member 39 also includes plural clamping bars 45 such as bars 45a and 45b. The bars 45 are elongate, extend laterally between and are rigidly affixed to the support bars 41, 43.

Referring particularly to FIGS. 1 and 2, the rack 10 includes a first adjustment mechanism 47 by which the dimension D1 may be selected in predetermined increments. Such mechanism 47 includes first and second rows of apertures 49, 51, respectively, in the first end panel 13 and third and fourth rows of apertures 53, 55, respectively, in the second end panel 15. While each such row 49, 51, 53, 55 may have a single row component 57 of apertures, smaller adjustment increments are facilitated when each row 49, 51, 53, 55 includes a side-by-side pair of such components 57 with particular apertures of one component, e.g., component 57a, being slightly vertically "staggered" from the corresponding apertures of the adjacent component 57b. Irrespective of whether rows or row components are used, the apertures 59 of a row component 57 are preferably arranged substantially vertically from one another.

The first adjustment mechanism 47 also includes a plurality of shoulder screws 61, four in the preferred embodiment. Each screw 61 extends through a respective aperture 59 in one of the four rows 49, 51, 53, 55, and threads into the retention member 39. Apertures 59 are preferably located and selected in such a way that in any vertical position of the retention member 39, such retention member 39 is parallel to the engagement platform 29 when the rack 10 is assembled for use.

Figure 4:
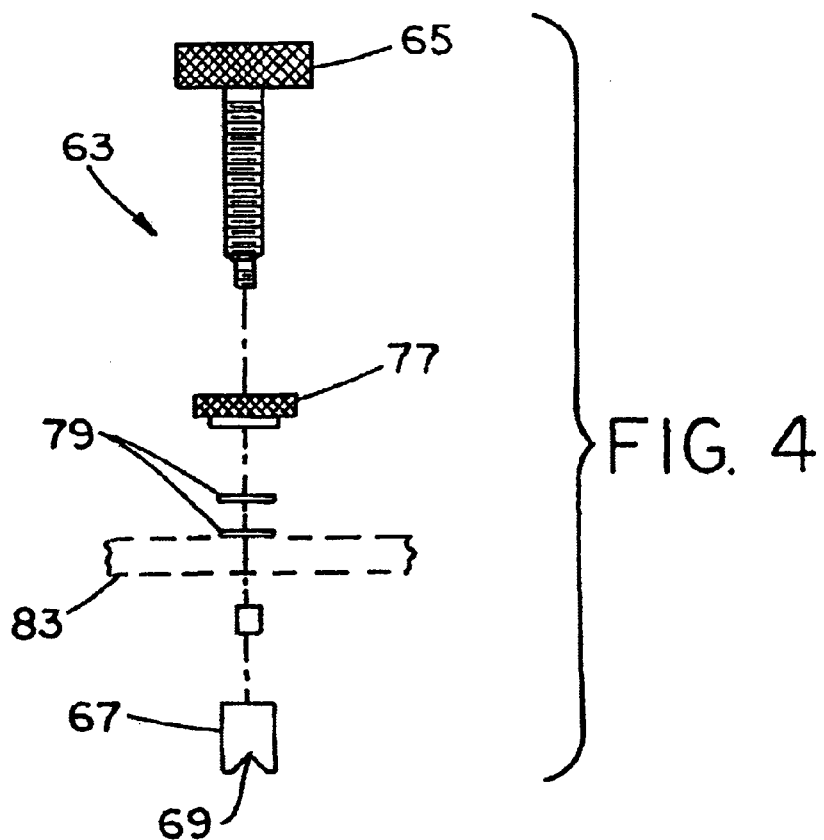
FIG. 4 is an exploded view of an exemplary second adjustment mechanism. A portion of the board retention member is shown in dashed outline.
Figure 5:
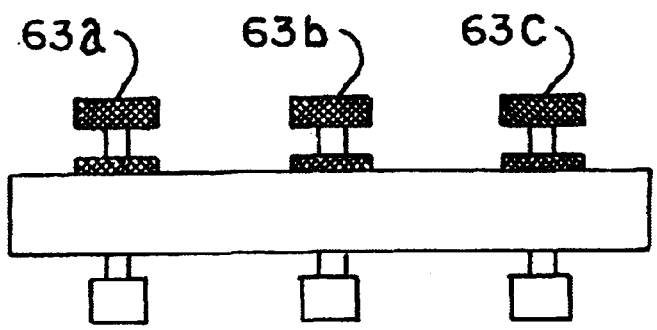
FIG. 5 is an elevation view of three of the second adjustment mechanisms affixed to an exemplary clamping bar.

Referring to FIGS. 4 and 5, the rack 10 also includes at least one second adjustment mechanism 63 (and preferably first, second and third mechanisms 63a, 63b, 63c, respectively) laterally spaced from one another on each clamping bar 45 of the retention member 39. Certain parts of each such second adjustment mechanism 63 are mounted for movement toward and away from the engagement platform 29 while the platform-to-retention member dimension D1 is held substantially constant.

Each of the second adjustment mechanisms 63 comprises a clamping screw 65 having its own locating pin 67. Each such pin 67 has a notch 69 formed therein. When the first or lower edge 37 and the second or upper edge 71 of a printed circuit board 35 are inserted between, respectively, a particular edge engagement member 31 and the second adjustment mechanism 63 immediately thereabove, the locating pins 67 of the individual mechanisms 63 are to be oriented so that the pin notches 69 engage the printed circuit board upper edge 71. The second adjustment mechanisms 63 are tightened to securely hold the boards 35 for vibratory testing. When such mechanisms 63 are tightened, compressive force is exerted on the boards 35 by the engagement platform 29 and the retention member 39. As represented by the arrows 73, 75, such force might be considered to be exerted substantially parallel to or substantially coincident with a planar surface of the printed circuit board 35. (FIG. 4 shows that each adjustment mechanism 63 has a clamping screw 65, a deck nut 77, a pair of vibration-proof washers 79 and a screw foot 81 which is press-fitted into the locating pin 67. The dashed outline 83 shows the location of a clamping bar 45 with respect to the components of the mechanism 63.)

Considering FIGS. 2 and 3, the dimension D1 is measured along a first axis 85 and each row of apertures (i.e., row 55) extends along a second axis 87 substantially parallel to the first axis 85. Each of the linear engagement grooves extends along a third axis 89 which is substantially perpendicular to the first axis 85. (It is to be appreciated that the dimension D1 could be measured anywhere along the engagement member 31 and between the panels 13, 15.)

It is to be understood that the locating pins 67 protrude below the underside of the retention member 39. Thus, the locating pins 67 (or at least an exemplary pin 67a) is spaced from the engagement platform 29 by a second dimension D2 which is somewhat less than the first dimension D1. The aforedescribed configuration of the second adjustment mechanism 63 permits the second dimension D2 to be selected in a continuum rather than in descrete increments.

In use, an operator of the test equipment is able to load circuit boards 35 "off line," i.e., by using a rack 10 other than the rack 10 bolted to the vibrator table 27 as shown in FIG. 1. Board loading is by slidably inserting the lower edge 37 of a board 35 into and along one of the grooves 33 in the platform 29, holding the board 35 vertically, aligning the notch(es) 69 of the corresponding adjustment mechanism(s) 63 with the upper edge 71 of the board 35 and tightening the mechanism(s) 63. While a rack 10 could be constructed to hold but a single board 35, more rapid testing will be facilitated if the rack 10 holds plural boards 35, e.g., twelve or so.

Assuming a rack 10 containing boards 35 is undergoing test during off line loading of another rack 10, the test rack 10 is removed at the conclusion of test by removing the bolts (not shown) from the openings 23, 25. The rack 10 which has been newly-loaded with boards 35 is bolted to the table 27 in place of the first rack 10. Usually, the circuit boards 35 undergoing test are operated (or at least electrically monitored) during such test. Electrical connections to such boards 35 may be by edge connectors, for example.

The material selected for rack construction must be sufficiently hard and rigid to effectively transmit table vibration to the boards 35 undergoing test. Magnesium and aluminum are suitable; lead and plastic are not.

Figure 6:
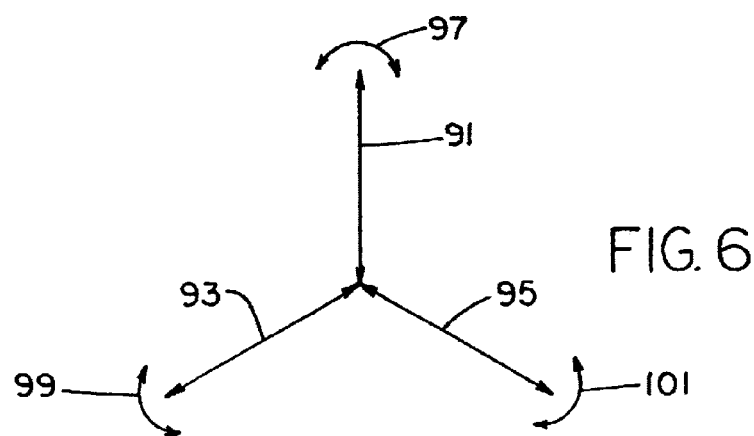
FIG. 6 is a representation of six axes of motion (three linear and three rotational) which may be applied to circuit boards mounted in the rack.

Referring also to FIG. 6, the new rack 10 is suitable for testing printed circuit boards 35 in what is known in the industry as six axes (three linear and three rotational) of motion. Such axes include three linear axes 91, 93, 95, respectively, and three rotational axes 97, 99, 101, respectively.

Figure 7:
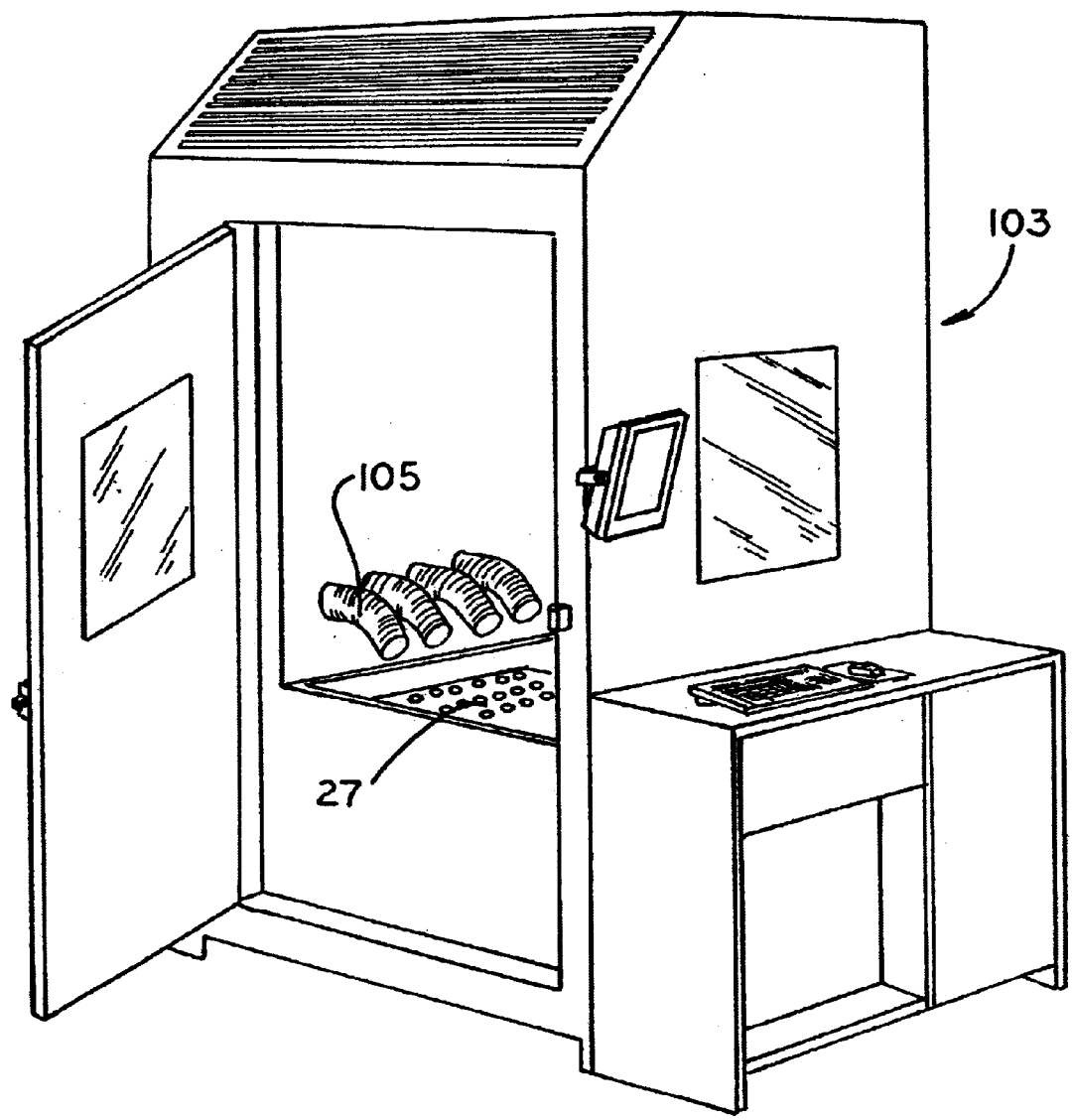
FIG. 7 is a perspective view of an environmental test chamber with which the rack might be used.

FIG. 7 shows a representative environmental test chamber 103 in which the rack 10 containing boards 35 is mounted. The vibrator table 27 (as well as the driving mechanism therefor) are in the chamber 103 and the rack 10 is bolted to the table 27 as described above. The ducts 105 are used to direct hot and cold air across the boards 35 during vibration testing.

In this specification, terms such as upper, lower, vertical, side-by-side and the like are used to facilitate understanding and are not intended to limit the scope of the invention. And while the principles of the invention have been shown and described in connection with preferred embodiments, it is to be understood that such embodiments are by way of example and are not limiting.

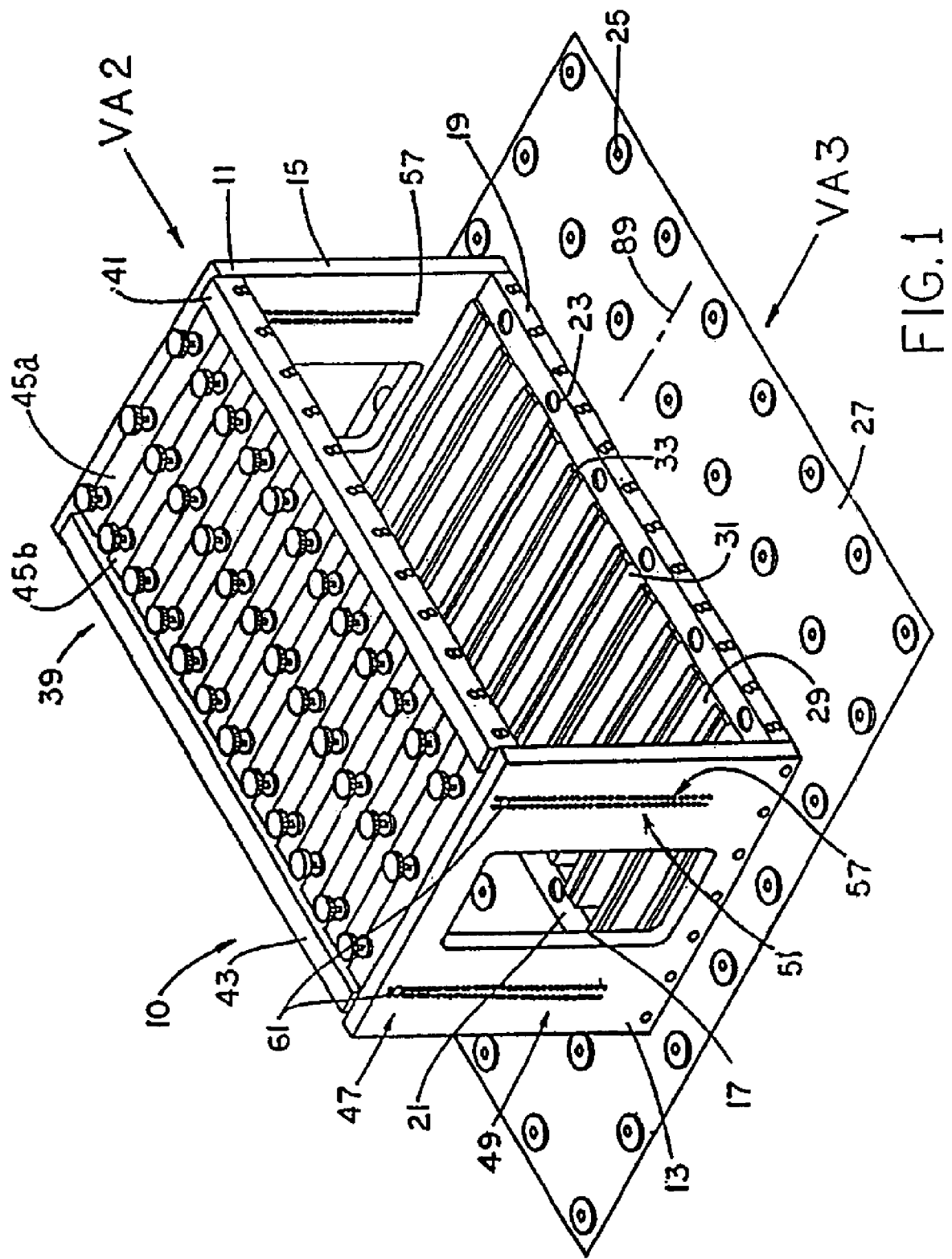

What is claimed is:

1. A support rack for supporting a circuit board having first and second opposite edges, the support rack comprising:

a board engagement platform having an edge engagement member adapted for contact with respect to the first edge;

a board retention element spaced from the engagement platform by a first distance, the board retention element having an edge retention member adapted for contact with respect to the second edge, the edge retention member spaced from the board retention element by a second distance and aligned with the edge engagement member;

a first adjustment mechanism interconnected with respect to the board engagement platform and the board retention element, the first adjustment mechanism permitting adjustment of the first distance; and a second adjustment mechanism connected with respect to the board retention element and the edge retention member, the second adjustment mechanism permitting adjustment of the second distance and maintaining the second distance after adjustment;

whereby the first and second adjustment mechanisms are independently adjustable to allow positioning of the edge retention member at a desired distance from the edge engagement member such that the edge engagement member and the edge retention member compress the circuit board by contacting the first and second edges, respectively, when the circuit board is supported by the support rack.

2. The rack of claim 1 wherein the first adjustment mechanism includes apertures spaced from one another, the first adjustment mechanism interconnecting the board engagement platform and the board retention element by affixing the board retention element to at least one aperture, the apertures permitting the first distance to be adjusted in predetermined increments.

3. The support rack of claim 1 wherein:
the board retention element has first and second clamping screws threaded thereto; and
the first clamping screw has a relatively-movable locating pin coupled thereto.

4. The support rack of claim 1 further comprising a frame including a pair of vertical, longitudinally-spaced end panels between which the board engagement platform and the board retention element are supported in spaced relationship to one another, and wherein the circuit board is clamped therebetween when the circuit board is supported by the support rack.

5. The rack of claim 2 wherein:
the first distance is measured along a first axis; and
the apertures are spaced along a second axis substantially parallel to the first axis.

6. The combination of claim 4 wherein:
the end panels are first and second end panels having, respectively, first and second rows of vertically-spaced-apart apertures;
first and second screws extend, respectively, through an aperture of the first and second rows and engage the board retention element.

7. The rack of claim 5 wherein:
the edge engagement member is a linear engagement groove extending along a third axis; and
the third axis is substantially perpendicular to the first axis.

8. The combination of claim 6 wherein:
the first and second rows of apertures and the first and second screws comprise the first adjustment mechanism whereby the first distance may be selected in predetermined increments; and
the first plurality of clamping screws comprises the second adjustment mechanism whereby the second distance may be selected in a continuum.

9. In combination, a circuit board having first and second opposite edges spaced apart by a circuit board length and a rack supporting the board, the rack comprising:
a frame;
a board engagement platform mounted with respect to the frame and engaging the first edge;
a board retention element spaced from the board engagement platform by a first distance;
a first adjustment mechanism coacting with the frame and the board retention element to provide adjustment of the first distance and to maintain the first distance; and
a second adjustment mechanism connected with respect to the board retention element and including an edge retention member for engaging the second edge;
and wherein:
the board engagement platform and the edge retention member are spaced apart by an operative distance equal to the circuit board length such that the platform and the edge retention member exert compressive force on the board by contacting the first and second opposite edges, respectively; wherein the second adjustment mechanism includes: a clamping screw threaded to the board retention element; and a locating pin mounted to the clamping screw for relative movement with respect to such screw, the pin including a notch which operates as the edge retention member which engages the second edge of the circuit board.

10. The combination of claim 9 wherein:
the board retention element includes a plurality of second adjustment mechanisms,
each second adjustment mechanism has a respective clamping screw;
each clamping screw is threaded to the board retention element; and
each clamping screw has a respective locating pin mounted thereto.

11. The combination of claim 9 wherein:
the board has a substantially planar surface; and
the compressive force is exerted substantially parallel to the planar surface.

12. The combination of claim 9 wherein:
the board has a substantially planar surface; and
the compressive force is exerted substantially coincident with the planar surface.

13. The combination of claim 9 further including a vibratory table supporting the rack and the board, and wherein:
the table includes a mounting surface having a plurality of holes formed therein;
the rack includes a frame having plural openings formed therein; and
fasteners extend through the openings into the holes, thereby securing the rack and the boards to the table.

14. The combination of claim 10 wherein:
each second adjustment mechanism has first, second and third clamping screws;
first, second and third locating pins are mounted on the first, second and third clamping screws, respectively; and
each locating pin is rotationally movable with respect to the respective clamping screw.

15. A support rack for supporting circuit boards, each circuit board having first and second opposite edges defining a length, the support rack comprising:
a board engagement platform having edge engagement members, each edge engagement member being adapted for contact with respect to the first edge of a respective circuit board;
a board retention element being connected with respect to the engagement platform and spaced from the engagement platform by a first distance; the board retention element having edge retention members, each edge retention member being adapted for contact with respect to the second edge of the respective circuit board, each edge retention member spaced from the board retention element by a second distance and aligned with a respective edge engagement member;
a first adjustment mechanism interconnected with respect to the board engagement platform and the board retention element, the first adjustment mechanism permitting adjustment of the first distance; and
a plurality of second adjustment mechanisms, each second adjustment mechanism being connected with respect to the board retention element and the respective edge retention member, each second adjustment mechanism permitting adjustment of the respective second distance;

whereby the first adjustment mechanism and each second adjustment mechanism are independently adjustable to allow positioning of each edge retention member at a respective desired distance from a respective edge engagement member such that each edge engagement member and respective edge retention member compress a respective circuit board by contacting the first and second edges of the respective circuit board, when the circuit boards are supported by the support rack.

16. The support rack of claim 15 wherein:

the board retention element has first and second pluralities of clamping screws threaded thereto;

each clamping screw of the first and second pluralities has a locating pin coupled thereto;

the circuit boards comprise first and second circuit boards;

the first circuit board is clamped between the platform and the first plurality of clamping screws when supported by the support rack; and the second circuit board is clamped between the platform and the second plurality of clamping screws when supported by the support rack.

17. The support rack of claim 15 wherein each edge engagement member is a linear engagement groove.

18. The support rack of claim 15 wherein each second adjustment mechanism maintains the respective second distance after adjustment.

19. The support rack of claim 17 wherein each second adjustment mechanism includes a clamping screw and a locating pin, the clamping screw being threaded to the board retention element and the locating pin being mounted to the clamping screw for relative movement with respect to such screw, the pin including a notch acting as the edge engagement member to engage the second edge of each respective circuit board.

20. In combination, a circuit board having first and second opposite edges and a rack supporting the board, the rack comprising:

a frame;

a board engagement platform mounted with respect to the frame and engaging the first edge;

a board retention element spaced from the board engagement platform by a first distance;

a first adjustment mechanism coacting with the frame and the board retention element to adjust and maintain the first distance; and a second adjustment mechanism connected with respect to the board retention element and engaging the second edge, the second adjustment mechanism including a clamping screw and a locating pin, the clamping screw threaded to the board retention element and the locating pin mourned to the clamping screw for relative movement with respect to such screw, the pin including a notch engaging the second edge of the circuit board;

and wherein the platform and the second adjustment mechanism exert compressive force on the board by the first and second opposite edges, respectively.

* * * * *

UNITED STATES PATENT AND TRADEMARK OFFICE
CERTIFICATE OF CORRECTION

PATENT NO. : 6,714,419 B2
DATED : March 30, 2004
INVENTOR(S) : Liken et al.

It is certified that error appears in the above-identified patent and that said Letters Patent is hereby corrected as shown below:

Drawings,
Please replace existing Figure 1 with the attached Figure 1 as originally supplied in preliminary amendment.

Column 10,
Line 23, after "pin", delete "mourned" and add -- mounted --
Line 27, after "by", add -- contacting --

Signed and Sealed this

First Day of February, 2005

JON W. DUDAS
*Director of the United States Patent and Trademark Office*